(12) United States Patent
Rushing

(10) Patent No.: US 6,331,832 B1
(45) Date of Patent: Dec. 18, 2001

(54) AUTO-RANGING DIGITAL DENSITOMETER WITH LOOKUP TABLE

(76) Inventor: Allen J. Rushing, 429 Tara La., Webster, NY (US) 14580

( * ) Notice: Subject to any disclaimer, the term of this patent is extended or adjusted under 35 U.S.C. 154(b) by 0 days.

(21) Appl. No.: 09/541,923

(22) Filed: Apr. 3, 2000

(51) Int. Cl.[7] .............................. H03M 1/18; H01J 40/14
(52) U.S. Cl. .................................. 341/139; 250/214 AG; 347/184
(58) Field of Search .................................. 341/138, 139; 250/559.11, 214 AG

(56) References Cited

U.S. PATENT DOCUMENTS

| | | |
|---|---|---|
| 3,918,815 | 11/1975 | Gadbois . |
| 3,947,806 | * 3/1976 | Corkhill et al. ..................... 341/138 |
| 4,118,712 | 10/1978 | Kawasaki . |
| 4,123,171 | 10/1978 | Kato et al. . |
| 4,300,203 | 11/1981 | Brown . |
| 4,473,029 | 9/1984 | Fritz et al. . |
| 4,546,060 | 10/1985 | Miskinis et al. . |
| 4,553,033 | 11/1985 | Hubble, III et al. . |
| 4,673,807 | 6/1987 | Kobayashi et al. . |
| 4,750,838 | 6/1988 | Dewolf et al. . |
| 4,905,005 | * 2/1990 | Arribard et al. ..................... 341/139 |
| 5,117,119 | 5/1992 | Schubert et al. . |
| 5,148,217 | 9/1992 | Almeter et al. . |
| 5,173,750 | 12/1992 | Laukaitis . |
| 5,341,089 | 8/1994 | Heen . |
| 5,483,200 | 1/1996 | Okabayashi et al. . |
| 5,486,914 | 1/1996 | Denove et al. . |
| 5,649,266 | 7/1997 | Rushing . |
| 5,773,827 | 6/1998 | Yazdy et al. . |
| 5,903,800 | 5/1999 | Stern et al. . |

* cited by examiner

Primary Examiner—Howard L. Williams

(57) ABSTRACT

An auto-ranging digital densitometer, for determining the optical density of a test sample, includes a photodetector and a digital logarithmic converter. Within the logarithmic converter, an amplifier circuit is adapted to produce an output signal proportional to intensity of light incident on the photodetector. The amplifier circuit has multiple gains that successively increase, one to the next, by a ratio between 2.3:1 and 5.7:1. Gain select logic selects the gain to provide good density resolution and avoid amplifier saturation. An analog-to-digital converter is adapted to convert the output signal of the amplifier circuit to digital format. A lookup table address is formed at least in part from the output of the analog-to-digital converter. The lookup table outputs at least the lower-order digits of the density value corresponding to the gain and the amplifier output. Density range is extended, resolution improved, and the requirement for a second lookup table is eliminated. The digital logarithmic converter portion of the densitometer is also applicable to other fields besides densitometry.

22 Claims, 12 Drawing Sheets

| A/D MSB & MSB-1 | A/D OTHER BITS | PRESENT GAIN | UP/DOWN COUNTER OPERATION |
|---|---|---|---|
| 00 | X (DON'T CARE) | <MAX. GAIN | UP (TO NEXT HIGHER GAIN) |
| 00 | X | =MAX. GAIN | INHIBIT |
| 01 or 10 | X | X | INHIBIT |
| 11 | ALL=1 (SATURATED) | >MIN. GAIN | DOWN (TO NEXT LOWER GAIN) |
| 11 | NOT ALL=1 | X | INHIBIT |

FIG. 4

| A/D COUNT "C" | AMPLIFIER OUTPUT TO A/D "V" | DENSITY FOR GAIN=G "D" | INTEGER SCALED DENSITY | | | | |
|---|---|---|---|---|---|---|---|
| | | | GAIN=G BINARY CODE=000 "H" | GAIN=4G CODE=001 | GAIN=16G CODE=010 | GAIN=64G CODE=011 | GAIN=256G CODE=100 |
| 64 | FS*C/255 | -LOG(V/FS)=.600 | D*255/(5*.6)=51 | H+51=102 | H+102=153 | H+153=204 | H+204=255 |
| 65 | - | 0.594 | 50 | 101 | 152 | 203 | 254 |
| 66 | - | 0.587 | 50 | 101 | 152 | 203 | 254 |
| 67 | - | 0.580 | 49 | 100 | 151 | 202 | 253 |
| 68 | - | 0.574 | 49 | 100 | 151 | 202 | 253 |
| - | - | - | - | - | - | - | - |
| - | - | - | - | - | - | - | - |
| 251 | - | 0.007 | 1 | 52 | 103 | 154 | 205 |
| 252 | - | 0.005 | 0 | 51 | 102 | 153 | 204 |
| 253 | - | 0.003 | 0 | 51 | 102 | 153 | 204 |
| 254 | - | 0.002 | 0 | 51 | 102 | 153 | 204 |
| 255 | FS(FULL-SCALE) | 0 | 0 | 51 | 102 | 153 | 204 |

FIG. 6

| A/D COUNT "C" | AMPLIFIER OUTPUT TO A/D "V" | DENSITY FOR GAIN=G "D" | INTEGER SCALED DENSITY 7 LSB's |
|---|---|---|---|
| 0 | OFFSET=FULL-SCALE/2.371 | -log(V/(S+OFFSET))=.375 | D*127/.375=127 |
| 1 | OFFSET+S*C/255 | 0.373 | 126 |
| 2 | - | 0.371 | 125 |
| 3 | - | 0.369 | 125 |
| 4 | - | 0.366 | 124 |
| - | - | - | - |
| - | - | - | - |
| - | - | - | - |
| 250 | - | 0.005 | 2 |
| 251 | - | 0.004 | 1 |
| 252 | - | 0.003 | 1 |
| 253 | - | 0.002 | 1 |
| 254 | - | 0.001 | 0 |
| 255 | OFFSET+S(SPAN)=FULL-SCALE | 0 | 0 |

FIG. 8

| A/D COUNT "C" | AMPLIFIER OUTPUT TO A/D "V" | LOG($V_{IN}$/10MV) GAIN=256G "D" | INTEGER SCALED LOGARITHM | | | | |
|---|---|---|---|---|---|---|---|
| | | | GAIN=256G BINARY CODE=000 "H" | GAIN=64G CODE=001 | GAIN=16G CODE=010 | GAIN=4G CODE=011 | GAIN=G CODE=100 |
| 64 | FS*C/255 | +LOG(V/10MV)=.000 | D*255/(5*.6)=0 | H+51=51 | H+102=102 | H+153=153 | H+204=204 |
| 65 | - | 0.007 | 1 | 52 | 103 | 154 | 205 |
| 66 | - | 0.013 | 1 | 52 | 103 | 154 | 205 |
| 67 | - | 0.020 | 2 | 53 | 104 | 155 | 206 |
| 68 | - | 0.026 | 2 | 53 | 104 | 155 | 206 |
| - | - | - | - | - | - | - | - |
| - | - | - | - | - | - | - | - |
| 251 | - | 0.593 | 50 | 101 | 152 | 203 | 254 |
| 252 | - | 0.595 | 51 | 102 | 153 | 204 | 255 |
| 253 | - | 0.597 | 51 | 102 | 153 | 204 | 255 |
| 254 | - | 0.599 | 51 | 102 | 153 | 204 | 255 |
| 255 | FS(FULL-SCALE) | 0.600 | 51 | 102 | 153 | 204 | 255 |

FIG. 11

AUTO-RANGING DIGITAL DENSITOMETER WITH LOOKUP TABLE

FIELD OF THE INVENTION

This invention relates generally to densitometers for measuring optical density. In particular, the invention relates to optical density measurement of toner-covered test patches or other areas for controlling process parameters in electrostatographic apparatus such as copiers and printers.

BACKGROUND OF THE INVENTION

In electrostatographic apparatus such as copiers and printers, automatic adjustment of process control parameters is used to produce images having well regulated darkness or optical density. Copier and printer process control strategies typically involve measuring the transmissive or reflective optical density of a toner image on an exposed and developed area (called a "test patch") of an image receiver. Optical density has the advantage, compared to transmittance or reflectance measures, of matching more closely to human visual perception. A further advantage, especially for transmission density, is that density is approximately proportional to the thickness of the marking material layer, over a substantial range.

Typically, toned process control test patches are formed on the photoconductor in interframe regions of the photoconductor, i.e., between image frame areas. An "on-board" densitometer measures the test patch density, either on the photoconductor or after transfer of the patches to another support member. From these measurements, the machine microprocessor can determine adjustments to the known operating process control parameters such as primary charger setpoint, exposure setpoint, toner concentration, and development bias.

A transmission type of densitometer is particularly well suited to transmissive supports.

In this type, a light source projects light, visible or infrared, through an object onto a photodetector such as a photodiode. In a copier/printer, the photoconductor passes between the light source and the photodetector. When the photoconductor has toner on the surface, the amount of light reaching the photodetector is decreased, causing the output of the densitometer to change. Based on this output, the amount of toner applied to the photoconductor can be varied as required in order to obtain consistent image quality. Another type of densitometer such as described in U.S. Pat. No. 4,553,033 to Hubble, III et al, uses reflected light flux rather than transmitted light flux to determine density, and is particularly suited to opaque reflective supports.

One well-known approach to converting to a density measure uses an analog logarithmic amplifier, as suggested by the mathematical logarithm (log) function in the definition of optical density:

$$D = -\log_{10}(T) \quad \text{Equation(1)}$$

where D is optical density, and T is transmittance or reflectance (for transmission density or reflection density, respectively). The subscript "10" indicates that the logarithm is to the base 10. Since T must be between 0 and 1, the logarithm of T is negative, and the minus sign (−) in equation (1) provides positive values for density, D.

The following U.S. Patents, for example, all teach the use of an analog logarithmic amplifier in a densitometer: U.S. Pat. Nos. 3,918,815 to Gadbois, 5,148,217 to Almeter et al, 5,173,750 to Laukaitis, and 5,903,800 to Stern et al. The high cost of precision analog logarithmic amplifiers does not seriously deter their use in expensive laboratory instruments. However, the high cost of analog logarithmic amplifiers has been an obstacle to the wide use of densitometers as built-in components within moderately priced copiers, printers, and other products.

Digital approaches to densitometer design have been advanced, as digital electronics improve in performance and decline in price, relative to analog logarithmic amplifiers. One digital approach in the prior art is to obtain a photodetector voltage signal representing intensity of transmitted or reflected light and convert this analog signal to digital form. The digital value is then used to enter a stored lookup table (LUT) of intensity and density values. The digital density value corresponding to the digital intensity value is read from the LUT. To cover a reasonably large range of density with the required resolution, an amplifier with selectable gain and a second LUT have been used.

U.S. Pat. No. 5,117,119 to Schubert et al discloses an automatic gain selection, i.e., an "auto-ranging" electronic circuit, along with a second LUT, to obtain high accuracy and resolution over an increased range of large densities. The first (or "base") LUT contains density values corresponding to an analog-to-digital (A/D) converter output for the lowest gain. The second (or "range") LUT is much smaller than the first LUT and contains the relative density corresponding to each available gain. It provides the additional density output associated with the gain selected. The two LUT outputs are summed to obtain the actual density measurement. U.S. patent application Ser. No. 09/185,842, now U.S. Pat. No. 6,222,176, (filed on Nov. 4, 1998 in the name of Rushing, et al) discloses an improvement wherein the density values are scaled in a manner that simplifies the addition the two LUT outputs.

The three ranges illustrated in the Schubert et al patent are divided by two threshold values in a 10:1 ratio. The circuit gains for the three ranges are in a ratio of 10:1, from one range to the next. Thus two ranges have 10:1 max-to-min light or voltage input ratios, and the third range (used for lowest light intensities or highest density) may have arbitrarily small input light or voltage level. The illustration in the Schubert et al patent shows a 10-bit A/D to attain resolution of 0.01 density units. The 10-bit analog-to-digital converter requires a "base" LUT of $2^{10} = 1024$ entries.

A major limiting factor in density resolution is the input voltage range that must be spanned by the A/D converter. Worst-case density resolution for each range comes at the high-density (low light intensity) end of the range, where the analog-to-digital converter resolution, i.e., one count, corresponds to the largest density increment. In the Schubert embodiment, where the A/D converter spans a 10:1 input voltage range, the density resolution at the low end of the A/D converter range (corresponding to high density) is 10 times as coarse as at the high end.

The Schubert et al patent uses multiple analog threshold levels for comparison to the light photodetector voltage signal. Low levels of electrical noise and circuit variability could degrade the comparator accuracy and reliability for the low-voltage thresholds.

With a gain ratio less than the 10:1 ratio of Schubert et al, resolution uniformity is improved. For example, a 2.0:1 gain ratio is suggested in U.S. patent application Ser. No. 09/185,926, now U.S. Pat. No. 6,225,618, (filed on Nov. 4, 1998 in the name of Rushing, et al). With the 2.0:1 ratio, density resolution at one end of the A/D converter range is 2.0 times as coarse as at the other end, and not 10 times as coarse as in Schubert et al.

With commonly available low-cost 1-of-8 analog switches, such as integrated circuit type MM74HC4051, available from Fairchild Semiconductor, a maximum of eight different gains are readily implemented using a single integrated circuit analog switch, with only a 3-bit gain select code. For eight gains in a 2.0:1 ratio, the corresponding range of transmittance or reflectance that can be measured is $2^8:1=256:1$, corresponding to a density range of $\log_{10}(256)=2.4$ density units However, many applications, such as within electrophotographic copier/printers, require a transmission density range of at least 3.0, corresponding to a transmittance ratio of 1000:1.

Since logarithmic conversion is at the heart of densitometry, logarithmic converters in other contexts may bear on densitometer applications. U.S. Pat. No. 5,341,089 to Heep discloses a digital circuit to convert an analog voltage input to decibel (dB) units. The dB output is defined as 10 times the logarithm (base 10) of the ratio of the power of the input signal relative to a reference power level This logarithmic conversion is of the same general type as used within densitometers, according to equation (1). The Heep disclosure has no selectable gain and no auto-ranging. Large inputs must first be scaled down by a manually adjusted voltage divider to obtain an input within the operating range, and an output from a second LUT is added to compensate for the scaling down. Interpolation between LUT values is applied to obtain the desired accuracy, adding complexity to the circuit and lengthening the time required obtaining a measurement update.

SUMMARY OF THE INVENTION

One object of the present digital densitometer invention is to obtain simultaneously both sufficiently wide density measurement range and good density resolution, with minimum circuit complexity. Gain ratios between 2.3:1 and 5.7:1 are shown to offer the density range of at least 3.0 needed for on-board densitometers, with eight or fewer gain resistors. Gain ratios less than 2.3:1 require complex circuitry with more than 8 gains to obtain a 3.0 density range. Gain ratios significantly more than 5.7:1 have highly nonuniform density resolution over the A/D converter range used. The preferred embodiments, with fixed gain ratios between 2.3:1 and 5.7:1, require only 8 bits in the A/D converter and 8-bit LUT entries, but yet have up to 10-bit density resolution over a density range of 3.00 or more. Other embodiments could have unfixed gain ratios within the same gain ratio range, where the ratio changes for successively increasing gains. For the preferred embodiments, gain selection circuitry and software program logic to select the appropriate gain according the A/D output are disclosed. The determination of values to pre-load into the LUT, and the address formation for the LUT, are also disclosed in detail.

Another object of the present invention is to eliminate the second LUT, and thereby further simplify the circuit and speed the acquisition of the final density result. In one embodiment, a single LUT contains, in each entry, all of the density digits, i.e., the complete density value, with no addition from a second LUT required. In other embodiments, a microcontroller (µC) sets the higher-order density digit or digits, according to the gain code alone, or according to the gain code and the A/D output. The microcontroller joins the higher-order digit(s) to the lower-order digits from the single LUT, to form the complete density value. These density digits may be binary, octal, decimal, hexadecimal, ASCII, or otherwise coded for storage in the LUT.

Yet another object of the present invention is to improve the density resolution attainable using a given number of A/D bits by offsetting the input voltage range. Owing to the operation of the gain select logic, some lower part of the full input voltage range is not used. The range offset exploits this by adapting the A/D converter such that the full range digital output count (0 to 255 for an 8-bit A/D) covers only that part of the input voltage range actually used, so that there are no unused and wasted output counts. Since there is a density increment associated with every A/D count, this results in better density measurement resolution.

Still another object of the present invention is to provide a digital logarithmic converter circuit, applicable not only in densitometers, but also in other applications where there is need to convert an input to an output proportional to the logarithm of the input. A digital logarithmic converter could be applied in a variety of fields. In photography the "f-stop" measure is proportional to the logarithm of aperture area. In chemistry the "pH" acid-base measure is proportional to the logarithm of ion concentration. In acoustics, the "dB" sound intensity measure is proportional to the logarithm of the sound power. In electronic circuits, "dB gain" is proportional to the logarithm of the voltage gain. In general, any signal varying over a wide dynamic range may be evaluated more readily without switching gain or scale by first passing the signal through a logarithmic converter.

To obtain these objects, an auto-ranging digital densitometer includes a photodetector and a digital logarithmic converter. Within the logarithmic converter, an amplifier circuit is adapted to produce an output signal proportional to intensity of light incident on the photodetector. The amplifier circuit has multiple gains that successively increase, one to the next, by a ratio between 2.3:1 and 5.7:1. Gain select logic selects the gain to provide good density resolution and avoid amplifier saturation. An A/D converter is adapted to convert the output signal of the amplifier circuit to digital format. A LUT address is formed at least in part from the output of the A/D converter. The LUT outputs at least the lower-order digits of the density value corresponding to the gain and the amplifier output. Density range is extended, resolution improved, and the requirement for a second lookup table is eliminated. The digital logarithmic converter portion of the densitometer is also applicable to other fields besides densitometry.

The invention and its various advantages will become more apparent to those skilled in the art from the ensuing detailed description of the preferred embodiments, reference being made to the accompanying drawings.

BRIEF DESCRIPTION OF THE DRAWINGS

The subsequent description of the preferred embodiments of the present invention refers to the attached drawings wherein:

FIG. 4 is a table defining the gain select and counter logic for the first preferred densitometer embodiment;

FIG. 6 is a table showing how the scaled density values are determined for pre-loading into the LUT of the first preferred densitometer embodiment;

FIG. 8 is a table showing how the scaled density values are determined for pre-loading into the LUT of the second preferred densitometer embodiment;

FIG. 11 is a table showing how, for one example, the scaled logarithm values are determined for pre-loading into the LUT of a general logarithmic converter circuit.

DETAILED DESCRIPTION OF THE INVENTION

I. Electrophotographic Printing Machine Environment

Because apparatus of the general type described herein are well known, the present description will be directed in particular to elements forming part of, or cooperating more directly with, the present invention. While the invention will be described with reference to imaging apparatus and particularly to an electrophotographic system, the invention can also be used in other imaging apparatus and in application not in the imaging field.

Figure 1:
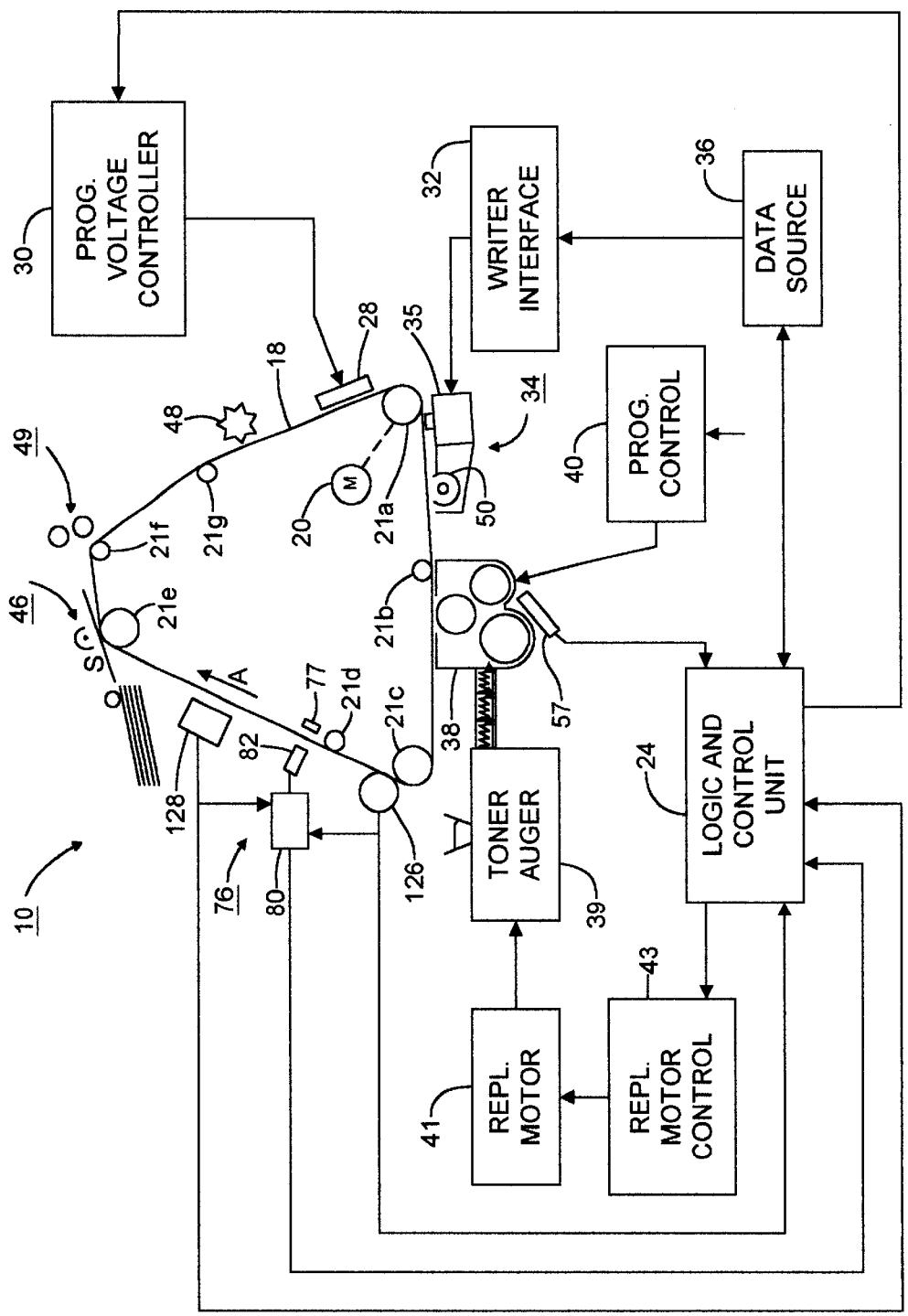
FIG. 1 is a side elevational view in schematic form of an electrophotographic apparatus to illustrate one environment for the use of this invention.

With reference to the electrophotographic copier and/or printer machine 10 as shown in FIG. 1, a moving recording member such as photoconductive belt 18 is entrained about a plurality of rollers or other supports 21a–21g one or more of which are driven by a motor 20 so as to advance the belt in a direction indicated by an arrow "A" past a series of workstations of machine 10. A logic and control unit (LCU) 24, which has a digital computer, has a stored program for sequentially actuating the workstations in response to signals from various sensors and encoders, as is well known.

A primary charging station 28 sensitizes belt 18 by applying a uniform electrostatic charge of predetermined primary voltage $V_0$ to the surface of the belt. The output of the charging station is regulated by a programmable voltage controller 30, which is in turn controlled by LCU 24 to adjust primary voltage $V_0$ for example through control of electrical potential ($V_{GRID}$) to a grid that controls movement of corona charges from charging wires to the surface of the recording member, as is well known. Other known forms of chargers, including roller chargers, may also be used.

At an exposure station 34, projected light from a write head 35 dissipates the electrostatic charge on the photoconductive belt to form a latent image of a document to be copied or printed. The write head preferably has an array of light-emitting diodes or other light source such as a laser or other spatial light modulator for exposing the photoconductive belt picture element (pixel) by picture element with a regulated intensity and exposure, $E_0$. Alternatively, the exposure may be by optical projection of an image of a document or a patch onto the photoconductor.

Where a light-emitting diode or other electro-optical exposure source or writer is used, image data for recording is provided by a data source 36 for generating electrical image signals. The data source 36 may be a computer, a document scanner, a memory, a data network, etc. Signals from the data source and/or LCU may also provide control signals to a writer interface 32 for identifying exposure correction parameters in, for example, a LUT for use in controlling image density. Travel of belt 18 brings the areas bearing the latent charge images into a development station 38. The development station has one (more if color) magnetic brushes in juxtaposition to, but spaced from, the travel path of the belt. Magnetic brush development stations are well known. For example, see U.S. Pat. Nos. 4,473,029 to Fritz et al and 4,546,060 to Miskinis et al. Other types of development stations may be used as is well known and plural development stations may be provided for developing images in plural colors or with toners of different physical characteristics.

Logic and control unit 24 selectively activates the development station in relation to the passage of the image areas containing latent images to selectively bring the magnetic brush into engagement with or a small spacing from the belt. The charged toner particles of the engaged magnetic brush are attracted imagewise to the latent image pattern to develop the pattern.

Conductive portions of the development station, such as conductive applicator cylinders, act as electrodes. The electrodes are connected to a variable supply of D.C. potential $V_B$ regulated by a programmable controller 40. Details regarding the development station are provided as an example, but are not essential to the invention.

A transfer station 46 as is also well known is provided for moving a receiver sheet "S" into engagement with the photoconductive belt in register with the image for transferring the image to a receiver. Alternatively, an intermediate member may have the image transferred to it and the image may then be transferred to the receiver. A cleaning station 48 is also provided after the transfer station for removing toner from the belt 18 to allow reuse of the surface for forming additional images. In lieu of a belt, a drum photoconductor or other structure for supporting an image may be used. After transfer of the unfixed toner images to a receiver sheet, such sheet is detacked from the belt and transported to a fuser station 49 where the image is fixed.

The LCU provides overall control of the apparatus and its various subsystems as is well known. Programming commercially available microprocessors is a conventional skill well understood in the art.

Figure 2:
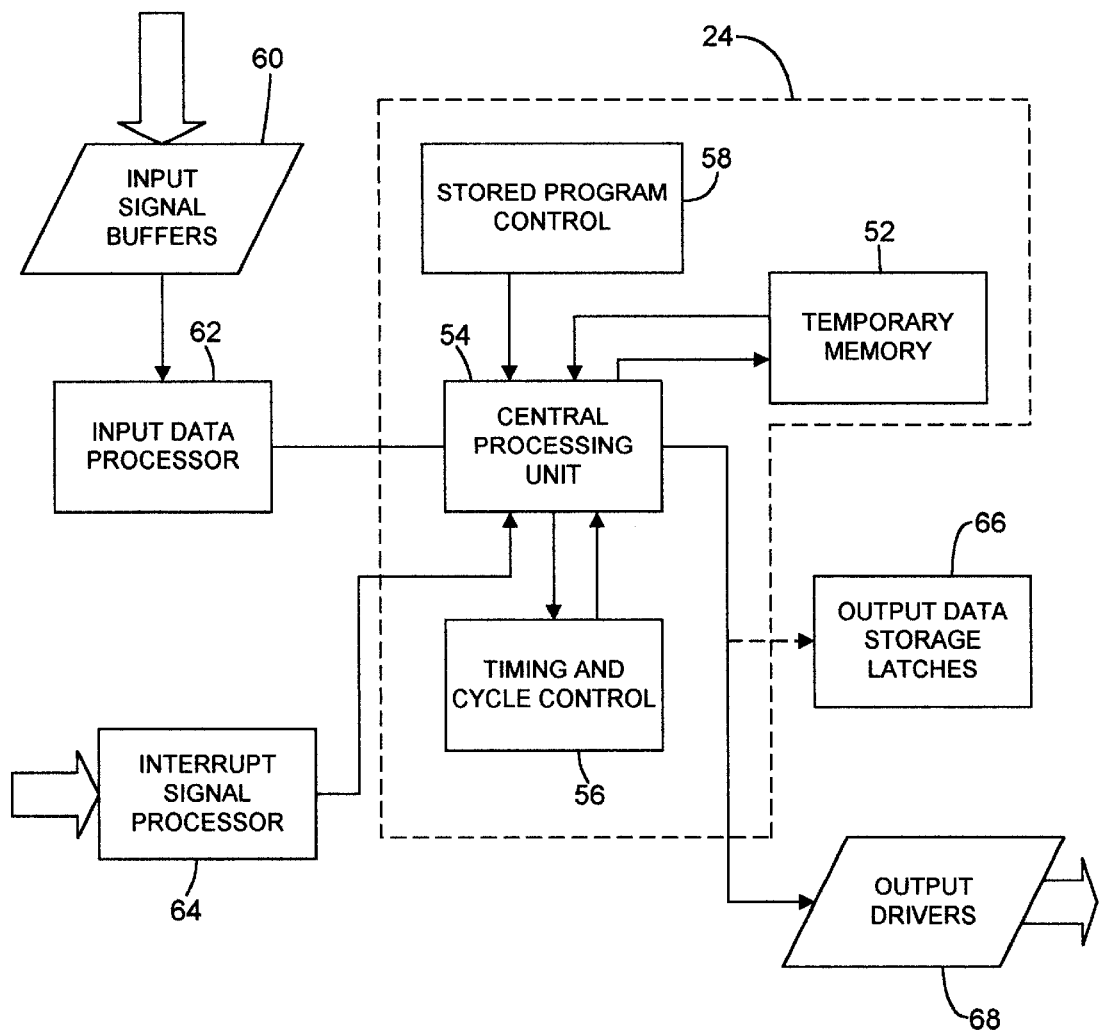
FIG. 2 is a block diagram of a logic and control unit (LCU) for controlling the apparatus of FIG. 1.

Referring to FIG. 2, a block diagram of a typical LCU 24 is shown. The LCU comprises temporary data storage memory 52, central processing unit 54, timing and cycle control unit 56, and stored program control 58. Data input and output is performed sequentially through or under program control. Input data are applied either through input signal buffers 60 to an input data processor 62 or through an interrupt signal processor 64. The input signals are derived from various switches, sensors, and the A/D converters that are part of the apparatus 10 or received from sources external to machine 10.

The output data and control signals are applied directly or through storage latches 66 to suitable output drivers 68. The output drivers are connected to appropriate subsystems. Process control strategies generally utilize sensors to provide real-time control of the electrostatographic process and to provide "constant" image quality output from the user's perspective.

Referring again to FIG. 1, one such sensor for process control may be a densitometer 76 to monitor development of test patches in non-image areas of photoconductive belt 18, as is well known in the art. See for example U.S. Pat. No. 5,649,266 to Rushing. The densitometer measurements are needed to insure that the transmission or reflection density of toned areas on the belt is maintained. The densitometer may include a visible or infrared light-emitting diode (LED) 77 which shines light through the belt or reflected by the belt onto a photodiode detector 82, which is connected to a densitometer circuit 80. The photodiode detector may be separate from the densitometer circuit, as shown in FIG. 1, or may be on the same circuit board as the densitometer circuit components.

For a transmission densitometer, emitter 77 may be on the untoned side of belt 18 and detector 82 on the toned side, as shown. Alternatively, the reverse arrangement is also workable. For a reflection densitometer, the emitter and detector would both be on the toned side of the belt. The detector generates an electrical signal that varies directly with the flux of light received. The densitometer circuit converts the detector signal to a density value.

A rotary encoder 126 engaging belt 18 outputs logic pulses corresponding to the motion of the belt. The pulse output enables the densitometer 76 to collect density readings synchronously with the belt motion. The pulse output is also connected to LCU 24 for synchronizing the operation of the various workstations. A "sync" pulse motion sensor 128 outputs a sync pulse, preferably only one for each belt once-around, to provide an indication of the absolute position of belt 18.

In the case of transmission density, the total, or gross, measured density value is reduced by the density value of a bare untoned patch, to obtain a value $D_{NET}$, representative of the net toner density. The net density signal is also representative of the thickness of the toner deposit averaged over the measurement area, and representative of the toner mass per unit area. The $D_{NET}$ signal may be used to adjust process parameters $V_0$, $E_0$, or $V_B$. The $D_{NET}$ signal may also be used to assist in the maintenance of the proper concentration of toner particles in the developer mixture by having the LCU provide control signals to a replenisher motor control 43.

Replenisher motor control 43 controls replenisher motor 41 that in turn drives a toner auger 39 for feeding new toner particles into development station 38. A toner concentration monitor probe 57 provides signals to the LCU about relative concentration of toner particles to carrier particles in the developer mix.

Another sensor useful for monitoring process parameters is an electrometer probe 50 which is mounted at a location preferably downstream of corona charging station 28, relative to the direction of the movement of belt 18. In FIG. 1 electrometer probe 50 is mounted immediately downstream of writehead 35.

II. First Preferred Densitometer Embodiment (8-Bit Output)

Figure 3:
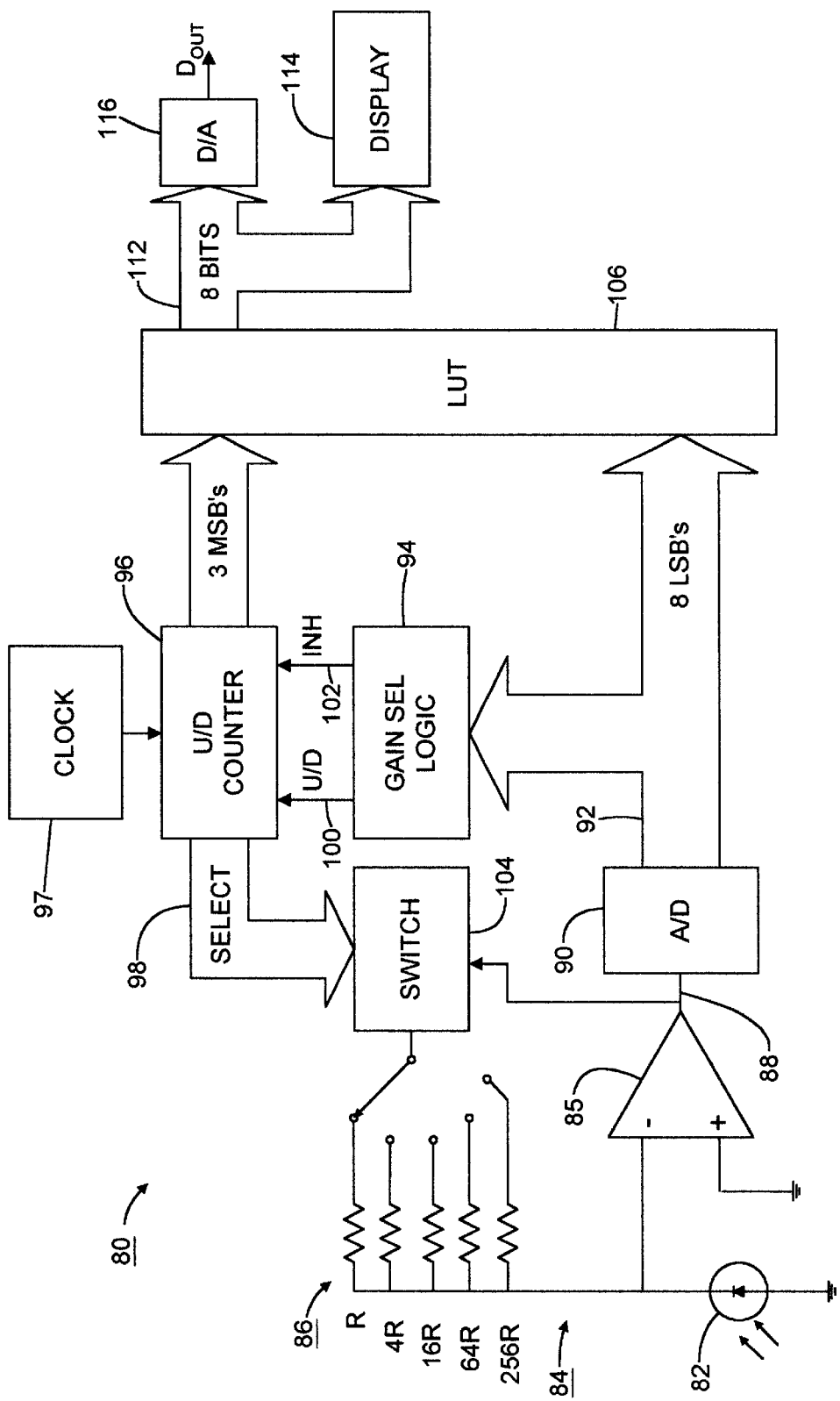
FIG. 3 is a block diagram of a densitometer according to the first preferred embodiment of the present invention.

The relatively large LUT in the first preferred densitometer embodiment contains a complete (all digits) integer scaled density entry for every combination of gain and A/D output. Referring to FIG. 3, photodiode detector 82 is connected to densitometer circuit 80 to provide a current output into an amplifier circuit 84. A feedback resistor system 86 around an operational amplifier 85 provides a determinable gain so that an amplifier output voltage 88 is proportional to the photocurrent in photodiode detector 82. Feedback resistor system 86 is programmable in real time to accommodate a wide range of light intensities, as explained below. Amplifier output 88 is input into an A/D converter 90 to produce an 8-bit digital output 92. An A/D converter with a parallel output is preferred, but a serial output A/D could also be used.

Figure 5:
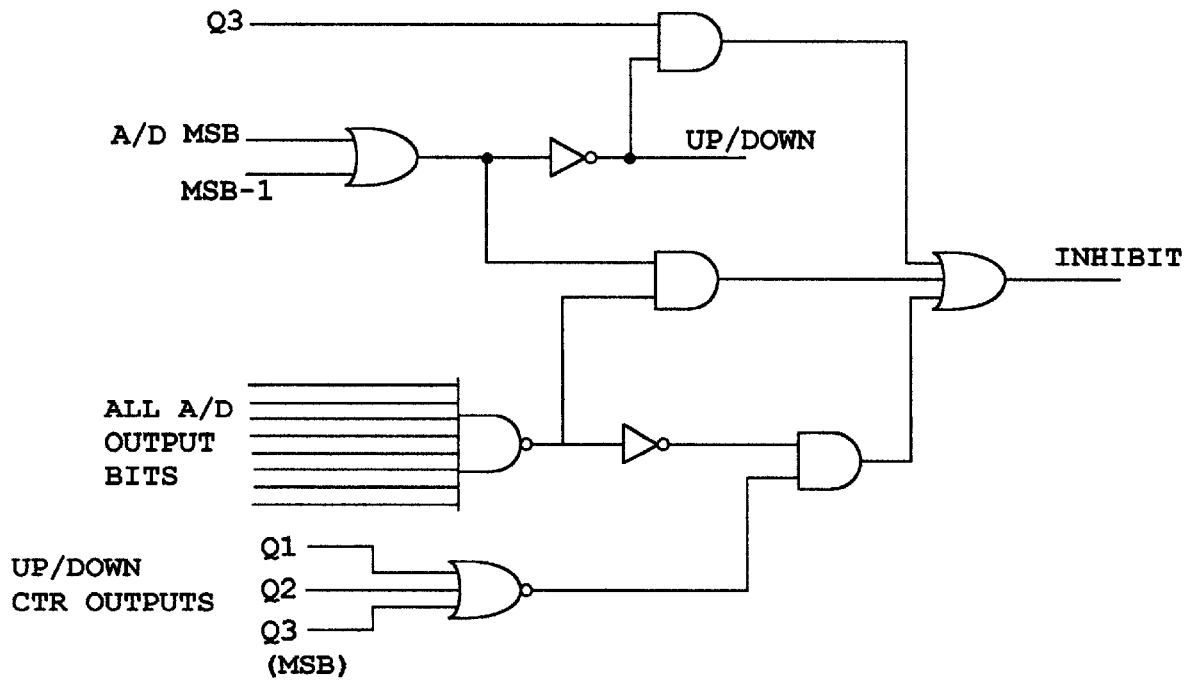
FIG. 5 is a logic circuit schematic for the gain select logic of the first preferred densitometer embodiment.

A/D converter output 92 is input to a gain select logic 94, the outputs of which go to a binary up/down counter 96. Counter 96 counts pulses from a clock 97 and outputs a 3-bit gain select code 98. The counter is inhibited, or driven up or down, by the two most-significant A/D converter output bits according to the table in FIG. 4. One gain select logic output 100 controls the up or down direction of counter 96. Another gain select logic output 102 inhibits the count when A/D converter output 92 has been driven within a desired range, or when the gain has been driven to the minimum or the maximum available gain. Gain select logic 94 drives the counter up or down as necessary to select a gain such that the A/D converter output is at least ¼ fill scale, but not saturated. A schematic of the discrete or "hard-wired" gain select logic is shown in FIG. 5.

Referring again to FIG. 3, 3-bit gain select code 98 from counter 96 is input to an analog switch 104 to select one of five precision resistors of variable feedback resistor system 86. The gain is set to provide a high level of sensitivity without saturation. That is, the gain is decreased if the amplifier output is saturated, or increased when the higher gain yields a non-saturated output, with better density resolution. The gain remains unchanged as long as the output is above a threshold determined by the gain ratio, but not saturated. By using resistor values related to each other in a preferred ratio, along with logic to switch the resistors according to the A/D conversion of the amplifier output, good density resolution is attained for test samples varying over a large density range. An automatic gain switching function such as just described makes the densitometer "auto-ranging".

In FIG. 3, the five gain resistors increase in value, one to the next, in a fixed ratio of 4.00:1. The corresponding range of transmittance or reflectance that can be measured is $4^5:1=1024:1$, corresponding to a density range of $\log_{10}$ (1024) or approximately 3.0 density units. This density range is scaled to integers from 0 to 255 for purposes of pre-loading, or "populating" LUT 106. This scaled density range is divided equally among the 5 gains, for 51 distinct scaled density values for each gain.

The table in FIG. 6 shows how the scaled density values to be pre-loaded into the LUT are computed for each gain and A/D output count. Values from columns designated "C", "V", "D", and "H" are used in computing values in columns following to the right, according to the equations at the top of each column.

With continuing reference to FIG. 3, the address input to LUT 106 has 11 bits, with 8 bits coming from A/D converter output 92, and the remaining 3 bits coming from 3-bit gain code 98. Preferably, for an orderly organization of the LUT contents, 3-bit gain code 98 forms the high-order 3 bits of the address, and 8 bit A/D converter output 92 forms the low-order 8 bits of the 11-bit address input. The least significant bit (LSB) of A/D converter output 92 is connected to the LSB of the LUT address, and so forth. Altogether there are 5 times 256 or 1280 entries in LUT 106. Memory storage for a LUT of this size is easily within the capacity of a single low-cost EEPROM (electrically erasable read-only memory) or PROM (programmable read-only memory) integrated circuit chip. Preferably, a parallel type of EEPROM or one-time-programmable PROM is used for LUT 106, so that all of the scaled density output bits are immediately and simultaneously available for connection to an output device. The 8-bit density output from the LUT may be connected to one or more output devices. Examples of such output devices include (a) a decimal display device, (b) a hexadecimal display device, (c) a binary display device, (d) a graphic display device, (e) a digital data storage device, (f) a digital connection to a host computer device or network, (g) a digital-to-analog (DIA) converter, and (h) an actuator for adjusting subsequent sample processing. For this first preferred embodiment, FIG. 3 shows a parallel connection from LUT output 112 to a display 114, and to a DIA converter 116.

Each LUT memory location is pre-loaded with the scaled density value corresponding to the gain and the A/D output corresponding to the LUT address. The zero-density reference point corresponds to 100% transmission, and maximum A/D output (255) with the lowest amplifier gain. Since the A/D input range is not offset from zero in this embodiment, those of the 1280 entries corresponding to A/D outputs less than ¼ of full scale (<64) are not used. The contents of each LUT entry is an 8-bit byte, representing a complete scaled density value, with a range of 0 to 255. Every integer scaled density value from 0 to 255 is contained in at least one LUT entry, so there are no skipped values, giving true 8-bit density resolution.

For other embodiments, the density range, the number of bits in the scaled density values, the number of gains, and the gain ratio can be selected to avoid skipped values of scaled density. If there are skipped values, the available design adjustments to eliminate the skips are to (a) reduce density range, (b) reduce bits in the scaled density values, or (c) increase the number of gains while decreasing the gain ratio. As a design alternative to the first preferred embodiment, a density range of 3.0 and 8-bit resolution could have been obtained with 4 gains in a 5.623:1 fixed ratio, with no skipped values in the 8-bit output. However, using 5 gains in a 4:1 ratio in the first preferred embodiment permits simpler discrete logic for the gain select function.

III. Second Preferred Densitometer Embodiment (10-Bit Output)

Figure 7:
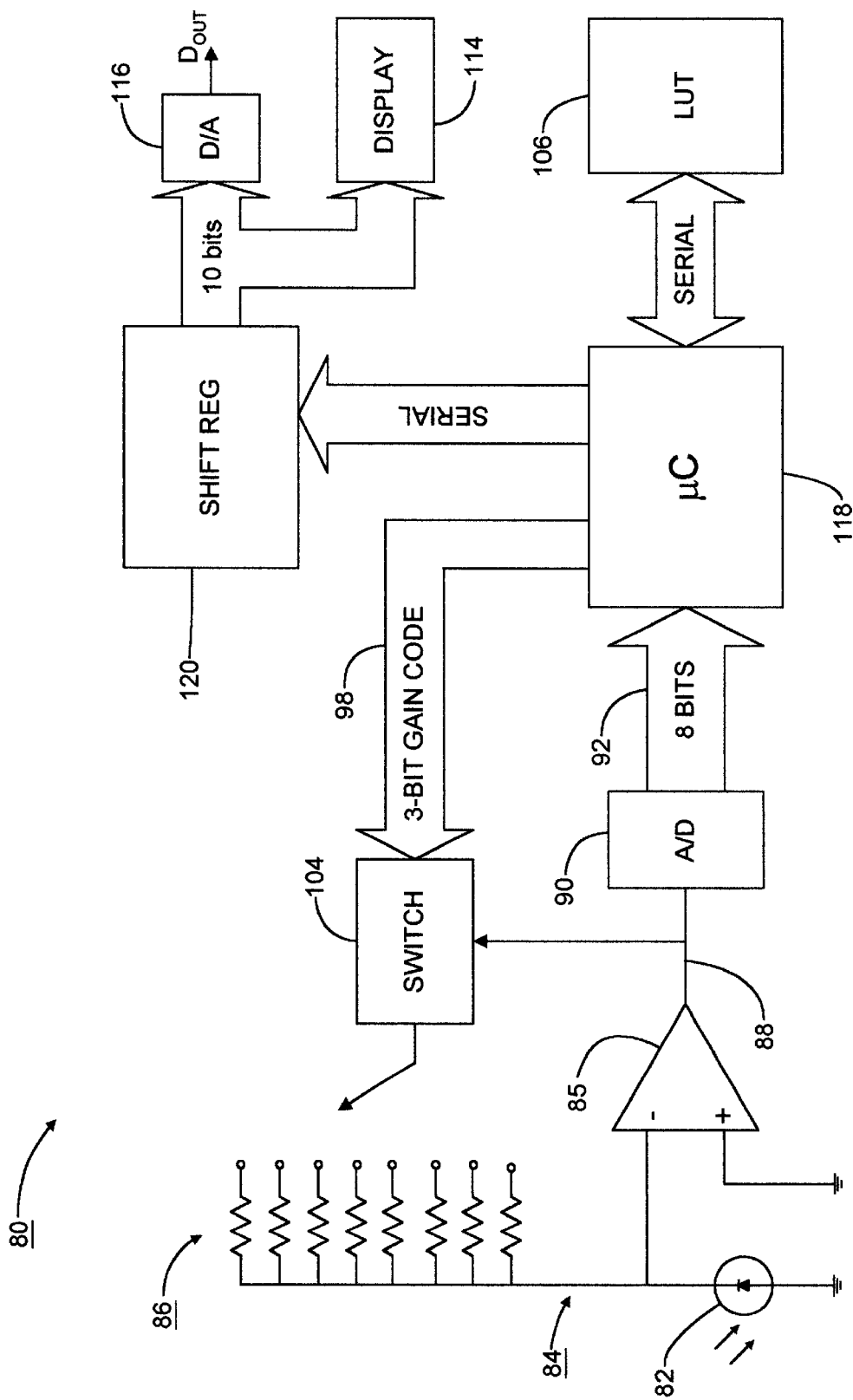
FIG. 7 is a block diagram of the densitometer according to the second preferred densitometer embodiment.

The relatively small LUT in the second preferred densitometer embodiment contains only the low-order digits (the "core" digits) of the integer scaled density values. The core digits for any given analog-to-digital converter output are the same regardless of gain. Referring to FIG. 7, densitometer circuit 80 is connected to photodiode detector 82 to provide a current output into amplifier circuit 84. Variable feedback resistor system 86 around operational amplifier 85 provides a determinable gain so that amplifier output voltage 88 is proportional to the photocurrent in photodiode detector 82. Feedback resistor system 86 is programmable in real time to accommodate a wide range of light intensities, as explained below. Amplifier output 88 is input into A/D converter 90 to produce 8-bit digital output 92. An A/D converter with a parallel output is preferred, but a serial output A/D could also be used.

A/D converter output 92 is input to a microcontroller 118, such as Microchip Corporation model PIC16C62A. The microcontroller is programmed to set the gain according to A/D converter output 92, and output a 3-bit gain select code 98. The gain select code input to switch 104 sets the gain to one of eight values such that the A/D converter output is neither zero nor saturated.

The eight precision gain resistors increase in value, one to the next, in a fixed ratio of 2.371:1. Each gain handles transmitted or reflected light intensity variation over a 2.371:1 ratio and a density increment of $\log_{10}(2.371)=0.375$ density units. The corresponding range of transmittance or reflectance that can be measured is $2.371^8:1=999:1$, corresponding to a density range of $\log_{10}(999)$ or approximately 3.00 density units.

Density scaling for this type of embodiment begins with a choice of a base-B number system (e.g., base-2 or base-10), in which to represent the scaled density values. The density increment corresponding to the gain ratio is scaled to K digits covering a range of 0 to $B^K-1$. The LUT is pre-loaded with these K digits in base-B. These values may be pre-loaded into the LUT in a variety of codes, such as binary, binary-coded decimal, ASCII, or any representation that can be interpreted when the LUT is read. When the LUT is read, the LUT outputs the K-digit base-B scaled density value, representing the low-order or core digits. The remaining higher-order digits are set according to the gain code.

In this particular second preferred embodiment, a binary representation (B=2) is chosen. The LUT is loaded with 7-bit , 0 to $2^7-1=127$ scaled density values. When reading an 8-bit byte from the LUT, the microcontroller uses only the 7 bits of the scaled density value. The remaining 3 higher-order bits are provided by the gain code, to complete the 10-bit scaled density value. The total range of the scaled density values is 0 to 1023. Every integer value from 0 to 127 is contained in at least one LUT entry, so there are no skipped values, and true 10-bit resolution is obtained.

The A/D input range is offset from zero to the lowest amplifier voltage output allowed by the gain select logic, which is the full scale A/D input voltage divided by the gain ratio of 2.371. Thus all of the A/D) output values between 0 and 255 are used, over a span which is the full-scale voltage minus the offset. Since the A/D output provides the complete LUT address, only 256 bytes of LUT storage are required. In this embodiment LUT 106 is contained in a serial PROM, and requires only a 2-wire serial connection to microcontroller 118. This minimizes the number of input/output (I/O) pins required to connect the microcontroller and the LUT integrated circuit chips.

The table in FIG. 8 shows how the scaled density values to be pre-loaded into the LUT are computed for each A/D output count. After the microcontroller selects the appropriate gain, it reads the LUT. Seven bits of the 8-bit byte are the 7 low-order bits of the scaled density value. The microcontroller joins these 7 bits to the 3-bit gain code representing the high-order 3 bits of the scaled density value to form the complete 10-bit scaled density value. Every 7-bit value from 0 to 127 is contained in at least one LUT entry, so there are no skipped values, and the density resolution is a true 10 bits.

The 10-bit result may be output to one or more output or display devices, or to a host computer device or network. The output may also be directly connected to proces controllers whereby the imaging process is adjusted according to the densitometer output. For example, the densitometer output could be directly connected to the programmable voltage controller for the charging station, or to the programmable controller setting the bias voltage $V_B$ for the development station.

Figure 9:
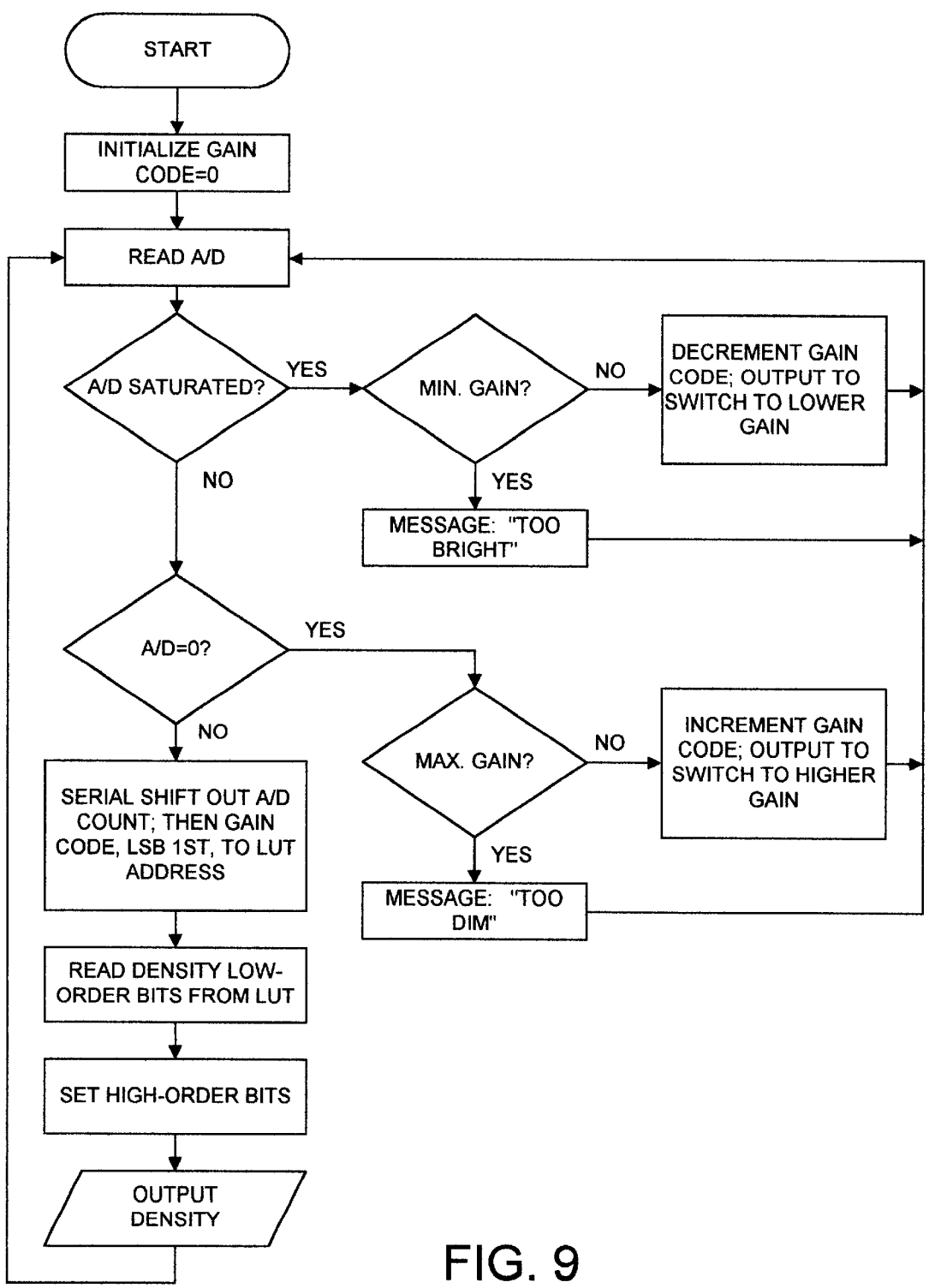
FIG. 9 is a program flow chart for the programmable microcontroller of the second preferred densitometer embodiment.

As shown in FIG. 7 for this embodiment, the 10-bit output is serially shifted out to serial-to-parallel shift register 120. Parallel connections are provided from the shift register to D/A converter 116, and to display 114, a row of 10 LED's. The foregoing densitometer operations are controlled according to the procedure set forth in the microcontroller program flowchart shown in FIG. 9.

IV. Third Preferred Densitometer Embodiment (9-Bit Output)

Figure 10:
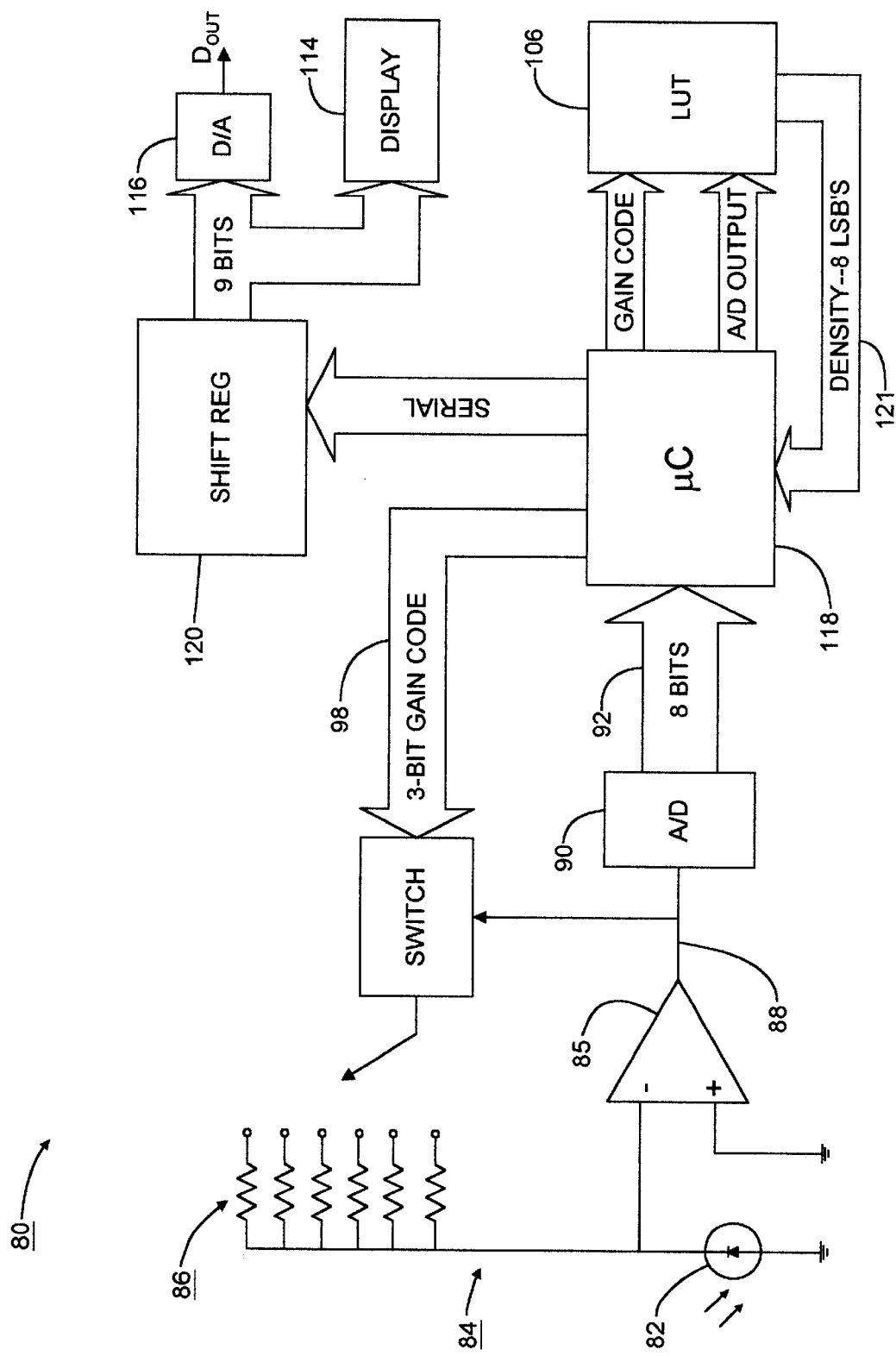
FIG. 10 is a block diagram of the densitometer according to the third preferred densitometer embodiment.

The relatively large LUT of the third preferred embodiment contains a density entry for every combination of gain and A/D output. However, because the scaled density values are 9-bit, while the LUT entries are 8-bit , these entries do not include the most-significant bit (MSB) of the scaled density values. The MSB is set by the microcontroller program logic, according to the gain and the A/D output Referring to FIG. 10, densitometer circuit 80 is connected to photodiode detector 82 to provide a current output into amplifier circuit 84. Variable feedback resistor system 86 around operational amplifier 85 provides a determinable gain so that the amplifier output voltage 88 is proportional to the photocurrent in photodiode detector 82. Feedback resistor system 86 is programmable in real time to accommodate a wide range of light intensities, as explained below. Amplifier output 88 is input to A/D converter 90 to produce 8-bit digital output 92. An A/D converter with a parallel output is preferred, but a serial output A/D could also be used.

A/D converter output 92 is input to microcontroller 118, such as Microchip Corporation model PIC16C62A. The microcontroller is programmed to set the gain according to A/D converter output 92, and output a 3-bit gain select code 98. The gain select code input to switch 104 sets the gain to one of six values such that the A/D converter output is neither zero nor saturated.

The six precision gain resistors increase in value, one to the next, in a fixed ratio of about 3.162:1. In this embodiment the A/D input is not offset from zero, so the threshold for switching to the next higher gain is when the A/D output becomes <255/3.162=81. Each gain handles transmitted or reflected light intensity variation over a 3.162:1 ratio and a density increment of $\log_{10}(3.162)=0.500$ density units. The corresponding range of transmittance or reflectance that can be measured is $3.162^8:1=1000:1$, corresponding to a density range of $\log_{10}(1000)$ or approximately 3.00 density units.

The address for LUT 106 is formed by the 3-bit gain code and the 8-bit A/D output. For an orderly LUT structure, the gain code is preferably used for the higher-order address bits. An 8-bit low-order output 121 from LUT 106 is the low-order part of the scaled density value corresponding to the gain code and A/D output forming the address.

The $9^{th}$ (most significant) density bit is set by the microcontroller. The threshold for changing the $9^{th}$ bit from 0 to 1 is at a predetermined gain and A/D output. This embodiment has an even number of gains (6), with the scaled density range of $511_{10}$ (decimal) or $111111111_2$ (binary) equally divided among them. Therefore the threshold for switching the $9^{th}$ bit from 0 to 1 is at the transition from the $4^{th}$ from the highest gain and A/D count =81, to the $3^{rd}$ from the highest gain and A/D count =255.

If the density range were equally divided among an odd number of gains, the threshold would be defined by the A/D count for the density midpoint of that gain. Given a threshold gain and A/D count, the microcontroller program logic tests the gain and A/D output against the threshold, and sets the $9^{th}$ bit accordingly. The complete 9-bit scaled density is transmitted serially to shift register 120, which has a 9-bit parallel connection to display device 114 and D/A converter 116.

V. A General Logarithmic Converter Embodiment

The preferred embodiments disclosed in the preceding sections are specifically for densitometers, where the input signal is from a photodiode detector sensitive to transmitted or reflected light and the output is a scaled density value. Equation (1) defines density as a negatively scaled logarithm of transmittance or reflectance. Any of the densitometer circuits described hereinbefore could be connected to a different voltage input device (rather than the photodiode detector). Then, with a LUT loaded for positively scaled logarithmic outputs, the circuit would provide a scaled logarithmic conversion of a generic voltage input.

For example, consider converting an analog input voltage $V_{IN}$ to dB gain, where dB gain is defined as +20 times the logarithm of ($V_{IN}/10$ mV), and $V_{IN}$ is in the range of 10 mV to 10 volts. $V_{IN}$ is connected to the input of the multiple gain amplifier circuit, and the LUT is loaded according to a positive scale factor. For $V_{IN}=10$ mV, the LUT outputs the zero-dB reference value. For $V_{IN}=10$ V, the LUT outputs the full-scale 8-bit value of 255, the integer scaled value representing 60 dB. The other LUT entries are determined similarly as shown in the table of FIG. 11.

Logarithmic conversion is useful in applications in still other fields such as photography, chemistry, and acoustics, to name a few. In such diverse applications, preferred ranges, resolutions, and gain ratios will sometimes be more extreme than for the densitometer application. A gain ratio, preferably fixed, between 2:1 and 10:1 will normally suffice. Ratios smaller than 2:1 would require an excessive number of gains to cover a substantial range, while providing a diminishing advantage of resolution uniformity within each range. Ratios larger than 10:1 have output resolution too poor at the low end of the amplifier output range.

Figure 12:
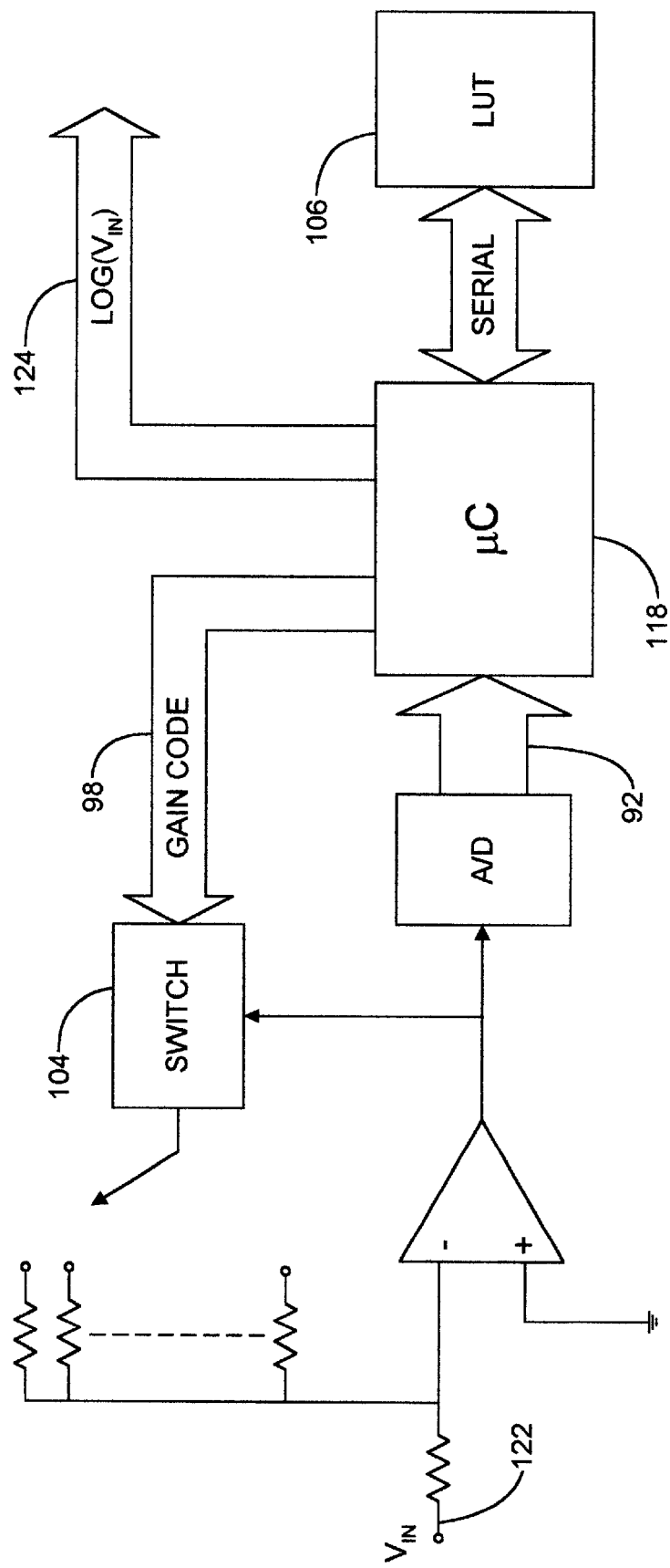
FIG. 12 is a block diagram of a general logarithmic converter embodiment.

FIG. 12 shows a preferred embodiment for a general logarithmic converter, using microcontroller 118. An input voltage signal 122 may come from any sensor or sensor amplifier providing a voltage signal $V_{IN}$ within the operating range of the converter. A logarithmic output 124, in either serial or parallel format, is a digital scaled logarithm of the input voltage $V_{IN}$. Logarithmic output 124 may be connected to any of a variety of devices according to the application, such as a display, a storage device, a host processor or network, or a D/A converter. LUT 106 is pre-loaded with scaled logarithm values, where the scale factor preferably provides a full-scale digital output in response to a full-scale voltage input. Microcontroller 118 receives A/D converter output 92, outputs gain code 98 to analog switch 104, reads LUT 106, and outputs scaled logarithmic output 124. As an alternative to the microcontroller, discrete non-programmable or "hard-wired" logic could also be used in a general logarithmic converter, just as in the first preferred densitometer embodiment.

CONCLUSION, RAMIFICATIONS, AND SCOPE

An auto-ranging digital densitometer which includes a photodetector and a digital logarithmic converter has been disclosed. Presently preferred embodiments have been described to illustrate several advantages. One advantage is an extended range of density that can be measured without undue circuit complexity. Using gain ratios between 2.3:1 and 5.7:1, needed density range and resolution has been obtained using simple circuitry, and only a single LUT. Further density resolution improvement is obtained by offsetting the input voltage range.

The logarithmic converter portion of the densitometer has been shown adaptable as a general digital logarithmic converter. Such a logarithmic converter is applicable in a variety of applications where there is need to convert an input to an output proportional to the logarithm of the input.

The invention has been described in detail with particular reference to certain preferred densitometer embodiments, but it will be understood that variations and modifications can be effected within the spirit and scope of the invention. It will also be recognized that the present invention may be used in other applications besides electrophotographic copiers and printers.

What is claimed is:

1. A digital logarithmic converter circuit comprising:
   an amplifier circuit adapted to produce an output voltage proportional to an input voltage, said amplifier circuit having multiple gains that increase one to the next by ratios between 2.3:1 to 5.7:1;
   an analog-to-digital converter adapted to convert said output voltage of said amplifier circuit to digital format; and gain select logic outputting a gain code used to select one of said multiple gains of said amplifier circuit, wherein said gain is changed in accordance with the output of said analog-to-digital converter, such that said amplifier circuit output is within a predetermined voltage range;

whereby said analog-to-digital converter output in combination with said gain code is characteristic of the logarithmn of said input voltage.

2. An auto-ranging densitometer for determining the optical density of a test sample, said densitometer comprising:

a photodetector;

an amplifier circuit adapted to produce an output signal proportional to light flux incident on said photodetector, said amplifier circuit having multiple gains that increase one to the next by ratios between 2.3:1 to 5.7:1;

an analog-to-digital converter adapted to convert said output signal of said amplifier circuit to digital format; and gain select logic outputting a gain code used to select the gain of said amplifier circuit;

whereby said analog-to-digital converter output in combination with said gain code is characteristic of the optical density of said test sample.

3. A digital auto-ranging densitometer as set forth in claim 2, and further including a lookup table for storing optical density information, said lookup table containing, in each entry therein, at least the lower-order digits of a scaled density value corresponding to said gain and the output of said analog-to-digital converter, whereby the output of said lookup table in combination with said gain code provides a digital density measurement of said test sample.

4. An auto-ranging densitometer as set forth in claim 1, wherein said gain code is set in accordance with said output of said analog-to-digital converter, such that said amplifier circuit output is within a predetermined range.

5. An auto-ranging densitometer as set forth in claim 3, wherein:

said analog-to-digital converter outputs a subset of a plurality of address bits input to said lookup table;

said gain code forms a remainder subset of said address bits input to said lookup table, such that said gain co d e in combination with said analog-to-digital converter provide a complete address to said lookup table; and said lookup table outputs all of the digits of said scaled density value corresponding to said analog-to-digital converter output and the selected gain.

6. An auto-ranging densitometer as set forth in claim 5, wherein said gain select logic comprises a programmable microcontroller, and said microcontroller addresses said lookup table and reads said lookup table output, whereby said digital density measurement is acquired by said microcontroller.

7. An auto-ranging densitometer as set forth in claim 2, wherein said amplifier circuit includes a plurality of feeedback resistors of different value, selectable by an analog switch, whereby said amplifier circuit has a determinable gain.

8. An auto-ranging densitometer as set forth in claim 5, wherein:

said gain select logic includes a periodic clock signal input to a binary up-down counter;

said counter is enabled only when said analog-to-digital converter output is outside a predetermined range; and said up-down counter counting direction is determined by whether said analog-to-digital converter output is above or below said predetermined range.

9. An auto-ranging densitometer as set forth in claim 3, wherein: successively larger gains are in a fixed ratio;

said lookup table contains scaled density values represented in a number system of base-B, where B is an integer between 2 and 20, inclusive;

said scaled density values are scaled such that the scaled density increment corresponding to a transmittance ratio equal to said fixed ratio is $B^K$, where K is an integer between 2 and 16, inclusive;

said analog-to-digital converter provides a complete set of input address bits to said lookup table;

said lookup table entries contain the K low-order digits of said scaled density value; and said gain code denotes the remaining high-order digits of said scaled density value, such that said gain code in combination with said lookup table provide a complete scaled density value.

10. An auto-ranging densitometer as set forth in claim 9, wherein:

said photodetector is a photodiode;

said amplifier circuit has 8 selectable feedback resistors of successively larger value, whereby said multiple gains increase successively by a ratio of about 2.37:1, corresponding to a density increment of 0.375, and the total density range spanned by said 8 gains is approximately 3.00 density units;

said analog-to-digital converter has an 8-bit output;

said gain select logic comprises a programmable microcontroller, which outputs a 3-bit gain code to an analog switch to connect 1 of 8 said resistors in the feedback path of said amplifier;

said lookup table comprises a programmable read-only memory, addressed by said 8-bit output from said analog-to-digital converter, and contains at each entry the 7 low-order binary bits of said scaled density value corresponding to the selected gain and said analog-to-digital converter output; and said microcontroller joins said 3-bit gain code to said 7 low-order bits to form said scaled density value of 10 binary bits, characteristic of the density of said test sample.

11. An auto-ranging densitometer as set forth in claim 3, wherein:

said analog-to-digital converter outputs a subset of a plurality of address bits input to said lookup table;

said gain code forms a remainder subset of said address bits input to said lookup table, such that said gain code in combination with said analog-to-digital converter provide a complete address to said lookup table;

said lookup table contains, in each entry therein, a low-order subset of digits of said scaled density value; and a high-order remainder subset of digits of said scaled density value are set according to said gain code and said analog-to-digital converter output, such that said high-order remainder subset, in combination with said low-order subset, form a complete scaled density value.

12. An auto-ranging densitometer as set forth in claim 2, wherein said analog-to-digital converter input range is offset from zero, thereby improving resolution by spreading the full range of said analog-to-digital converter output count over a smaller analog input range.

13. An auto-ranging densitometer as set forth in claim 3, further including means to load said scaled density value output from said lookup table into at least one receiving device from the group consisting of decimal display devices, hexadecimal display devices, binary display devices, graphic display devices, digital data storage devices, host computers, networks, digital-to-analog converters, and means for adjusting subsequent sample processing.

14. An auto-ranging densitometer as set forth in claim 13, wherein said means to load includes means to serially shift out bit-by-bit said scaled density value to at least one receiving device of said types.

15. An auto-ranging densitometer as set forth in claim 13, wherein said means to load includes means for parallel output of said scaled density value to at least one receiving device of said types.

16. A process for determining the optical density of a test sample, said process comprising the steps of:

illuminating said test sample, with light impinging first upon said test sample, and thence from said test sample to a photodetector;

producing an analog electrical signal proportional to the instantaneous light flux incident on said photodetector;

amplifying said electrical signal according to a selected gain to produce an amplified signal, where said gain is selected from gains that increase one to the next by ratios between 2.3:1 to 5.7:1;

converting said amplified signal to a digital value;

selecting said gain such that said digital value is within a predetermined range; and employing said selected gain and said digital value to obtain the optical density value of said test sample.

17. A digital auto-ranging densitometer for determining the optical density of a test sample, said densitometer comprising:

a photodetector;

an amplifier circuit adapted to produce an output signal proportional to light flux incident on said photodetector, said amplifier circuit having multiple gains;

an analog-to-digital converter adapted to convert said output signal of said amplifier circuit to digital format;

gain select logic outputting a gain code used to select the gain of said amplifier circuit; and a lookup table for storing optical density information, said lookup table containing, in each entry therein, at least the lower-order digits of a scaled density value corresponding to said gain and the output of said analog-to-digital converter;

whereby the output of said lookup table in combination with said gain code provides a digital density measurement of said test sample.

18. A digital auto-ranging densitometer as set forth in claim 17, wherein:

said analog-to-digital converter outputs a subset of a plurality of address bits input to said lookup table;

said gain code forms a remainder subset of said address bits input to said lookup table, such that said gain code in combination with said analog-to-digital converter provide a complete address to said lookup table; and said lookup table outputs all of the digits of said scaled density value corresponding to said analog-to-digital converter output and the selected gain.

19. A digital auto-ranging densitometer as set forth in claim 17, wherein:

successively larger gains are in a fixed ratio;

said lookup table contains scaled density values represented in a number system of base-B, where B is an integer between 2 and 20, inclusive;

said scaled density values are scaled such that the scaled density increment corresponding to a transmittance ratio equal to said fixed ratio is $B^K$, where K is an integer between 2 and 16, inclusive;

said analog-to-digital converter provides a complete set of input address bits to said lookup table;

said lookup table entries contain the K low-order digits of said scaled density value; and said gain code denotes the remaining high-order digits of said scaled density value, such that said gain code in combination with said lookup table provide a complete scaled density value.

20. A digital auto-ranging densitometer as set forth in claim 17, wherein:

said analog-to-digital converter outputs a subset of a plurality of address bits input to said lookup table;

said gain code forms a remainder subset of said address bits input to said lookup table, such that said gain code in combination with said analog-to-digital converter provide a complete address to said lookup table;

said lookup table contains, in each entry therein, a low-order subset of digits of said scaled density value; and a high-order remainder subset of digits of said scaled density value are set according to said gain code and said analog-to-digital converter output, such that said high-order remainder subset, in combination with said low-order subset, form a complete scaled density value.

21. A digital logarithmic converter circuit comprising:

an amplifier circuit adapted to produce an output voltage proportional to an input voltage, said amplifier circuit having multiple gains that increase one to the next;

an analog-to-digital converter adapted to convert said output voltage of said amplifier circuit to digital format;

gain select logic outputting a gain code used to select one of said multiple gains of said amplifier circuit, wherein said gain is changed in accordance with the output of said analog-to-digital converter, such that said amplifier circuit output is within a predetermined voltage range; and a lookup table for storing logarithm information, said lookup table containing, in each entry therein, at least the lower-order digits of a scaled logarithm value corresponding to said gain and the output of said analog-to-digital converter, whereby the output of said lookup table in combination with said gain code provides a scaled logarithm of said input voltage.

22. A digital logarithmic converter as set forth in claim 21 wherein said gains are in a ratio, one to the next, between 2.3:1 to 5.7:1.

* * * * *